US008534898B2

(12) United States Patent
Sun

(10) Patent No.: US 8,534,898 B2
(45) Date of Patent: Sep. 17, 2013

(54) LIGHT GUIDE AND ELECTRONIC DRIVE HAVING SAME

(75) Inventor: Zheng-Heng Sun, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 313 days.

(21) Appl. No.: 13/025,283

(22) Filed: Feb. 11, 2011

(65) Prior Publication Data

US 2012/0163012 A1 Jun. 28, 2012

(30) Foreign Application Priority Data

Dec. 27, 2010 (CN) .......................... 2010 1 0606927

(51) Int. Cl.
*H01L 33/02* (2010.01)

(52) U.S. Cl.
USPC ............ 362/616; 362/558; 385/136; 385/137

(58) Field of Classification Search
USPC .......................................... 362/558, 613, 615
See application file for complete search history.

(56) References Cited

U.S. PATENT DOCUMENTS 7,866,874 B2 * 1/2011 Liu et al. ........................ 362/634
8,279,372 B2 * 10/2012 Shimura et al. ................. 349/65

* cited by examiner

*Primary Examiner* — Anabel Ton
(74) *Attorney, Agent, or Firm* — Altis & Wispro Law Group, Inc.

(57) ABSTRACT

An electronic device includes a chassis, a circuit board, and a light guide. The chassis includes a rear panel defining an opening. The circuit board is installed in the chassis. A connector is mounted to a rear end of the circuit board aligning with the opening. Two spaced light emitting diodes are mounted at a rear end of the connector. The light guide includes a connecting plate mounted to an outer side of the rear panel, and two light guiding posts extending from a bottom of the connecting plate. Front ends of the light guiding posts extend through the opening of the rear panel and align with the light emitting diodes of the connector, to transmit light generated by the light emitting diodes rearwards and upwards.

6 Claims, 3 Drawing Sheets

LIGHT GUIDE AND ELECTRONIC DRIVE HAVING SAME

BACKGROUND

1. Technical Field

The present disclosure relates to a light guide, and an electronic device having the light guide.

2. Description of Related Art

Registered Jack-45 (RJ-45) connectors are widely used in network communication. In use, an RJ-45 connector is engaged in an interface of a chassis of a computer. The interface includes two light emitting diodes, used to indicate whether the network connection is working properly. However, in most cases, the interface is defined in a rear end of the chassis, thus light generated by the light emitting diodes is only seen from the back of the chassis, which is inconvenient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
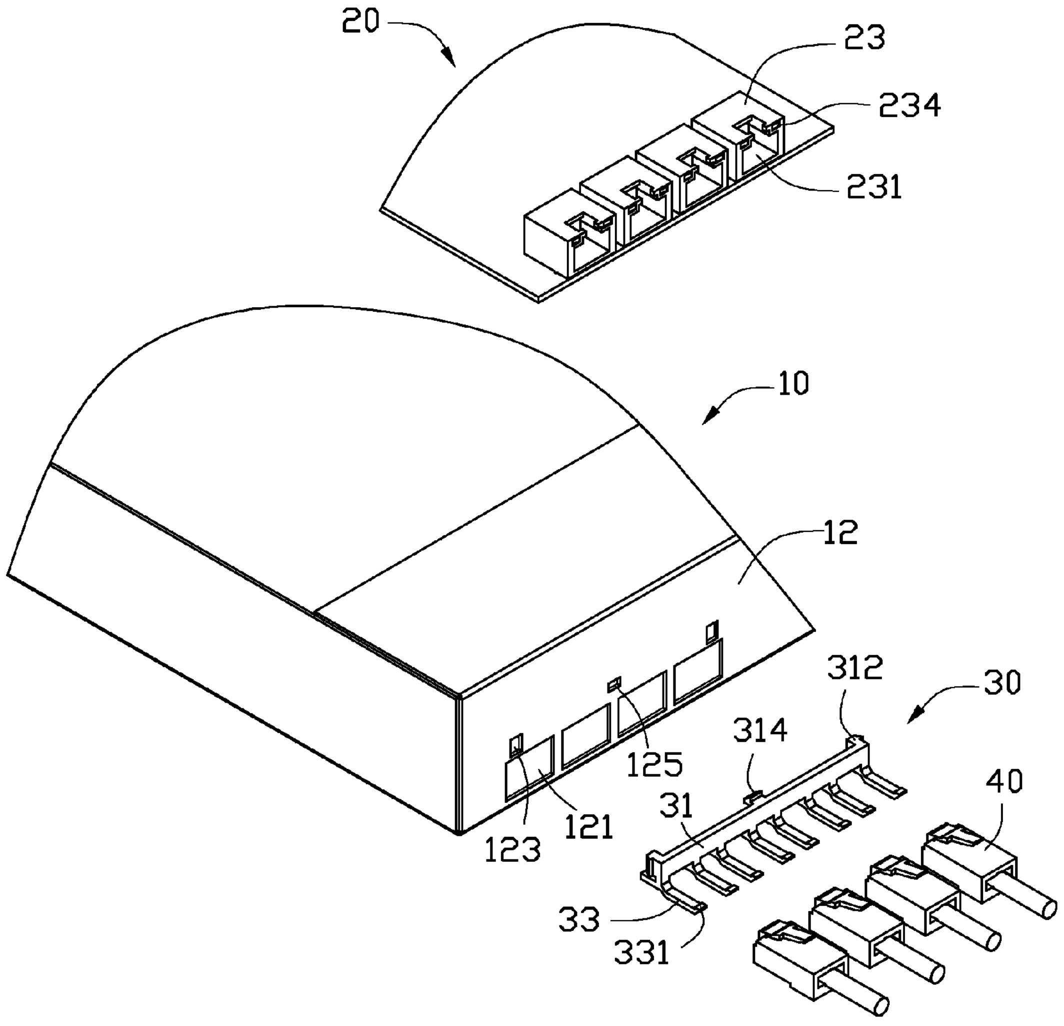
FIG. 1 is a partial, exploded, isometric view of an embodiment of an electronic device together with a plurality of Registered Jack-45 (RJ-45) connectors, the electronic device including a light guide.

Referring to FIG. 1, an embodiment of an electronic device includes a chassis 10, a circuit board 20, and a light guide 30.

The chassis 10 includes a rear panel 12. A plurality of openings 121 is defined in the rear panel 12. Two spaced first slots 123 are defined in the rear panel 12 above the openings 121. A second slot 125 is defined in the rear panel 12, between the first slots 123.

A plurality of connectors 23 is mounted to a rear end of the circuit board 20. An engaging slot 231 is defined in a rear end of each connector 23. Two spaced light emitting diodes 234 are mounted at the rear end of each connector 23 above the corresponding engaging slot 231.

Figure 2:
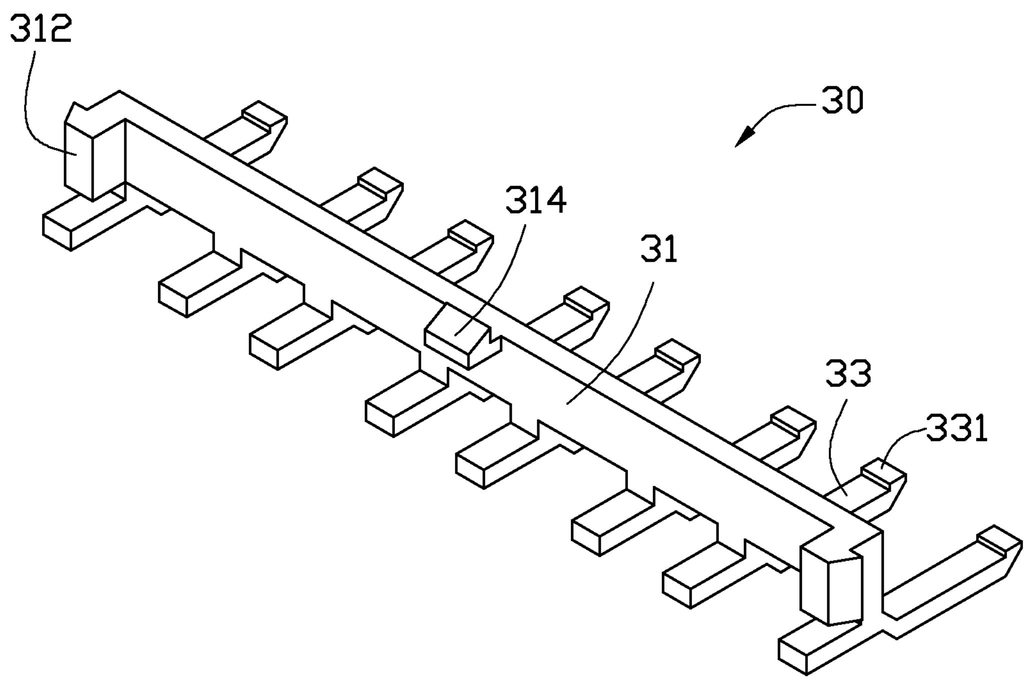
FIG. 2 is an enlarged, isometric view of the light guide of FIG. 1, but viewed from another perspective.

Referring to FIG. 2, the light guide 30 includes an elongated connecting plate 31, and a plurality of spaced light guiding posts 33. Two first hooks 312 protrude out from opposite ends of a front side of the connecting plate 31. A second hook 314 extends up from the front side of the connecting plate 31, between the first hooks 312. The light guiding posts 33 extend substantially perpendicularly from a bottom of the connecting plate 31, with front and rear ends of each light guiding post 33 respectively protruding away from front and rear sides of the connecting plate 31. A protrusion 331 extends up from the rear end of each light guiding post 33.

Figure 3:
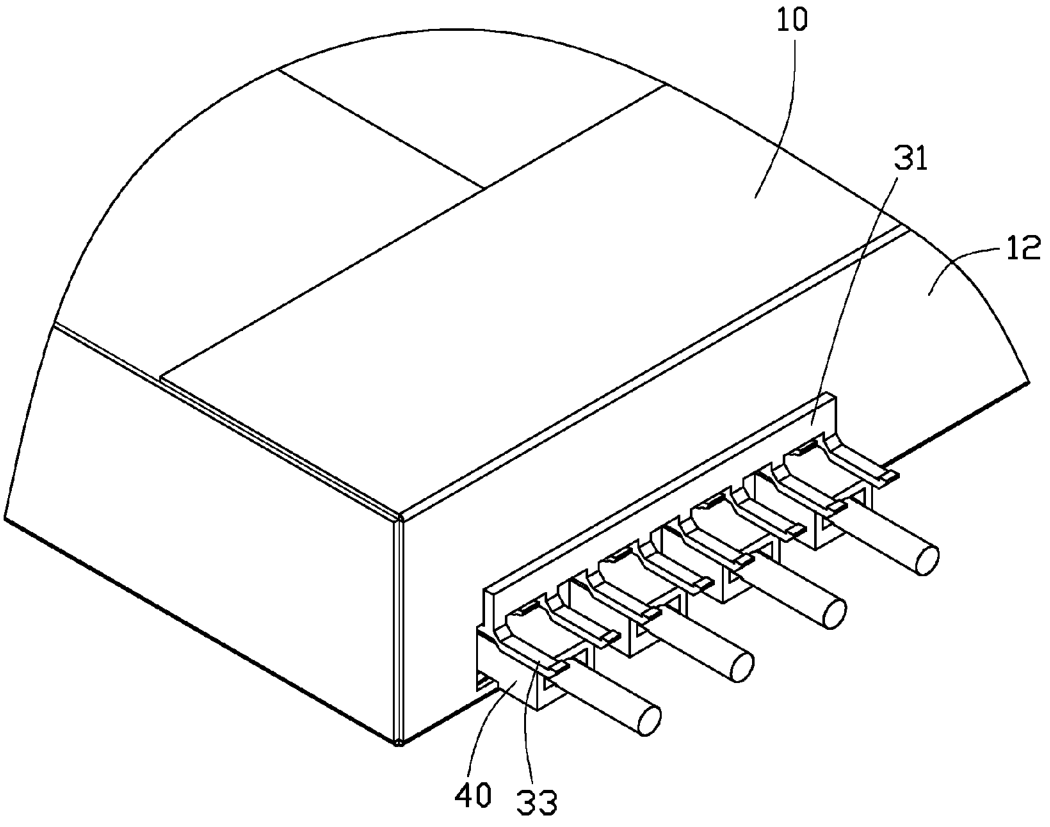
FIG. 3 is an assembled, isometric view of FIG. 1.

Referring to FIG. 3, in assembly, the circuit board 20 is installed in the chassis 10, with the connectors 23 respectively aligning with the openings 121 of the rear panel 12 of the chassis 10. The light guide 30 is mounted to an outer side of the rear panel 10, with the first hooks 312 of the light guide 30 engaging in the corresponding first slots 123 of the rear panel 12, and the second hook 314 of the light guide 30 engaging in the second slot 125 of the rear panel 12. Front ends of the light guiding posts 33 extend through the corresponding openings 121 of the rear panel 12, and align with the corresponding light emitting diodes 234 of the connectors 23.

A plurality of Registered Jack-45 (RJ-45) connectors 40 is provided to respectively extend through the openings 121 of the chassis 10 and engage in the engaging slots 231 of the corresponding connectors 23, to allow the RJ-45 connectors 40 to be electrically connected to the corresponding connectors 23. The light guiding posts 33 of the light guide 30 transmit light generated by the light emitting diodes 234 to tops of the corresponding protrusions 331. Therefore, the light can be easily seen.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A light guide, comprising:

an elongated connecting plate, two hooks protruding from a front side of the connecting plate; and at least two spaced light guiding posts extending from a bottom of the connecting plate, each of the light guiding posts comprising front and rear ends respectively protruding away from front and rear sides of the connecting plate, and a protrusion extending up from the rear end of each of the light guiding posts, for transmitting light up.

2. The light guide of claim 1, wherein each of the light guiding posts is substantially perpendicular to the connecting plate.

3. An electronic device, comprising:

a chassis comprising a rear panel defining an opening therein;

a circuit board installed in the chassis;

a connector mounted to a rear end of the circuit board and aligning with the opening of the rear panel;

two light emitting diodes mounted at a rear end of the connector and spaced apart; and a light guide comprising a connecting plate mounted to an outer side of the rear panel, and two light guiding posts extending from a bottom of the connecting plate, each of the light guiding posts comprising front and rear ends respectively protruding away from front and rear sides of the connecting plate, and a protrusion extending up from the rear end of each of the light guiding posts, the front ends of the light guiding posts extending through the opening of the rear panel and aligning with the light emitting diodes of the connector, to transmit light generated by the light emitting diodes to tops of the protrusions.

4. The electronic device of claim 3, wherein two first slots are defined in the rear panel above the opening and spaced apart, and two first hooks protrude outwards from opposite ends of the front side of the connecting plate, to engage in the first slots of the rear panel.

5. The electronic device of claim 4, wherein a second slot is defined in the rear panel between the first slots, a second hook extends upwards from the front side of the connecting plate between the first hooks, to engage in the second slot of the rear panel.

6. The electronic device of claim 3, wherein each of the light guiding posts is substantially perpendicular to the connecting plate.

* * * * *